(12) United States Patent
Royle

(10) Patent No.: US 10,142,043 B2
(45) Date of Patent: Nov. 27, 2018

(54) TIME DIFFERENTIAL DIGITAL CIRCUIT

(71) Applicant: VIAVI SOLUTIONS INC., Milpitas, CA (US)

(72) Inventor: David J. Royle, Rockville, MD (US)

(73) Assignee: VIAVI SOLUTIONS INC., Milpitas, CA (US)

( * ) Notice: Subject to any disclaimer, the term of this patent is extended or adjusted under 35 U.S.C. 154(b) by 81 days.

(21) Appl. No.: 15/290,882

(22) Filed: Oct. 11, 2016

(65) Prior Publication Data

US 2018/0102863 A1 Apr. 12, 2018

(51) Int. Cl.
| | |
|---|---|
| H04J 3/06 | (2006.01) |
| H04L 7/04 | (2006.01) |
| G01R 25/00 | (2006.01) |
| H03L 7/00 | (2006.01) |
| H04L 12/24 | (2006.01) |
| H04L 29/06 | (2006.01) |

(52) U.S. Cl.
CPC ............ *H04J 3/0667* (2013.01); *G01R 25/00* (2013.01); *H03L 7/00* (2013.01); *H04J 3/0697* (2013.01); *H04L 7/043* (2013.01); *H04J 3/065* (2013.01); *H04J 3/0685* (2013.01); *H04L 41/0604* (2013.01); *H04L 41/0631* (2013.01); *H04L 69/28* (2013.01)

(58) Field of Classification Search
CPC ...... H04J 3/0602; H04J 3/0605; H04J 3/0614; H04J 3/0617; H04J 3/0635; H04J 3/065; H04J 3/0655; H04J 3/0664; H04J 3/0667; H04J 3/0685; H04J 3/0691; H04J 3/0694; H04J 3/0697; H04L 2012/5674; H04L 7/043; H04L 2027/0073; H04L 2027/0083; H04L 2027/0085; H04L 2027/0089; H04L 2027/0097; H04L 1/1678; H04L 9/3297; H04L 29/06891; H04L 29/06993; H04L 41/0604; H04L 41/064; H04L 41/0631; H04L 43/106; H04L 47/28; H04L 69/28; H04L 63/1406
See application file for complete search history.

(56) References Cited

U.S. PATENT DOCUMENTS

| | | | | |
|---|---|---|---|---|
| 5,430,485 A | * | 7/1995 | Lankford | H04N 5/04 348/423.1 |
| 6,836,295 B1 | * | 12/2004 | Cooper | H04N 5/073 348/512 |
| 7,020,894 B1 | * | 3/2006 | Godwin | H04N 5/60 348/180 |
| 7,295,578 B1 | * | 11/2007 | Lyle | G06F 3/14 348/473 |
| 7,418,012 B2 | * | 8/2008 | Busch | H04N 21/23608 370/508 |
| 9,055,332 B2 | * | 6/2015 | Westin | H04N 7/152 |
| 9,596,073 B1 | * | 3/2017 | Reyes | H04L 7/0037 |
| 2008/0080563 A1 | * | 4/2008 | Kataria | H04J 3/0664 370/503 |
| 2013/0342632 A1 | * | 12/2013 | Su | H04N 7/147 348/14.01 |

* cited by examiner

*Primary Examiner* — Warner Wong
(74) *Attorney, Agent, or Firm* — Mannava & Kang, P.C.

(57) ABSTRACT

A time differential digital circuit can detect a time difference between first and second event signals. The time difference measurement can be calibrated to account for transmission path delays. The time differential digital circuit can be implemented using field programmable gate array transceivers.

20 Claims, 9 Drawing Sheets

TIME DIFFERENTIAL DIGITAL CIRCUIT

BACKGROUND

Many network applications running on modern digital telecommunications networks rely on accurate time synchronization for correct operation. For example, telecommunication networks may rely on the use of highly accurate primary reference clocks which are distributed network-wide using synchronization links and synchronization supply units. If switches in the networks do not operate with the same clock rates, then throughput may be degraded. File system updates carried out by a number of computers may depend on synchronized clocks. Network security mechanisms may depend on coordinated times across the network. For cellular networks, time synchronization is used to synchronize cell towers to the same clock signal so the cell towers can transmit in predetermined slots without collision.

For time synchronization, typically, independent clocks are synchronized to a clock reference signal. Various protocols and standards may be used for time synchronization. For example, Network Time Protocol (NTP) is a protocol for clock synchronization between computer systems over packet-switched network. NTP may maintain time to within tens of milliseconds over the Internet, and can achieve better accuracy in a local area network. Precision Time Protocol (PTP) is another protocol used to synchronize clocks throughout a computer network. PTP is a more recent protocol and may provide better accuracy than NTP. Global Positioning System (GPS) is also commonly used for time synchronization, but requires a GPS receiver and a line of sight to a GPS satellite.

BRIEF DESCRIPTION OF DRAWINGS

Features of the present disclosure are illustrated by way of examples shown in the following figures. In the following figures, like numerals indicate like elements, in which.

DETAILED DESCRIPTION

Figure 1:
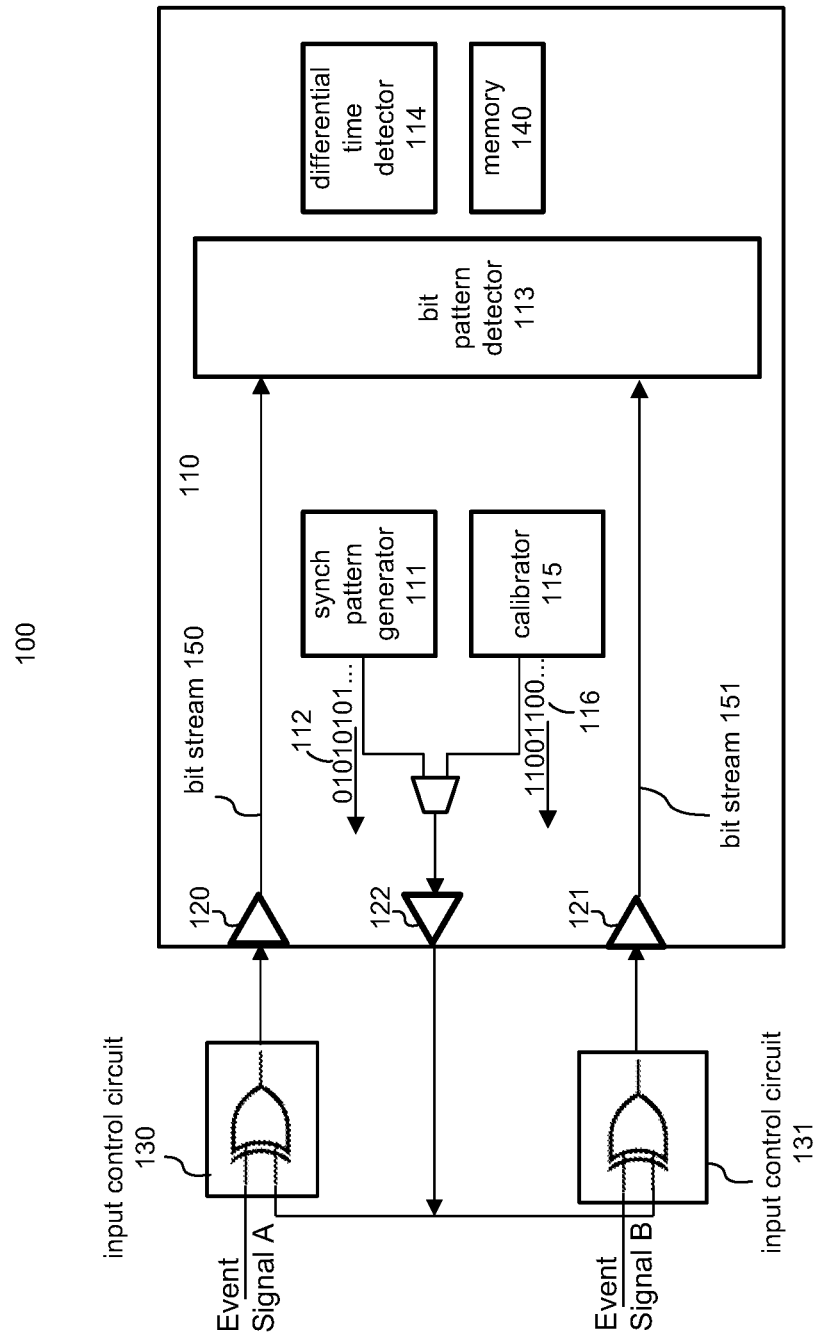
FIG. 1 illustrates a time differential digital circuit, according to an example of the present disclosure.

For simplicity and illustrative purposes, the present disclosure is described by referring mainly to examples thereof. In the following description, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the description of the examples of the present disclosure. Throughout the present disclosure, the terms "a" and "an" are intended to denote at least one of a particular element. As used herein, the term "includes" means includes but not limited to, the term "including" means including but not limited to. The term "based on" means based at least in part on.

According to an example of the present disclosure, a time differential digital circuit is operable to measure the time difference between event signals. An event signal is a signal indicative of an occurrence of an event. In an example, the event signals are clock signals, and the occurrence of an event may be the rising edge of a clock signal. One clock signal may be from a local clock and the other clock signal may be from an external source. The clock signals may be pulse per second (PPS) signals. A PPS signal is an electrical signal that has a width of less than one second and a sharply rising or abruptly falling edge that accurately repeats once per second. A time difference between the local clock signal and the external clock signal is determined, and an oscillator of the local clock signal is calibrated based on the time difference so the local clock signal is synchronized with the external clock signal. In other examples, an event signal may be indicative of any type of event other than a clock signal. The event signals may be digital signals.

The time differential digital circuit may measure the time difference between events at a time resolution of less than 1 nanosecond. For example, time difference between event signals may be measured in increments, each having a duration of less than 1 nanosecond. Accordingly, the time differential digital circuit may measure the time difference between events at a time resolution that is better than many existing protocols and standards. The time difference resolution may be based on the transmission rate of inputs and an output of the time differential digital circuit. For example, if a 3.125 Gigabit per second (Gbps) transceiver is used for the inputs and output of the time differential digital circuit, the duration of the increments, as determined according to the 3.125 Gbps transmission rate, is 320 picoseconds. Furthermore, the time differential digital circuit can determine the time difference between events, regardless of the order of which event signals for the events are received. For example, event A preceding event B produces a positive time difference, and event B preceding event A produces a negative time difference. Furthermore, the time differential circuit is a digital circuit that insensitive or less sensitive to temperature and voltage when compared to analog circuits. Furthermore, the time differential digital circuit may be implemented using field programmable gate arrays (FPGAs), FPGA transceivers of the FPGAs, and logic gates.

FIG. 1 illustrates a time differential digital circuit 100, according to an example of the present disclosure. The time differential digital circuit 100 for example is an integrated circuit. The time differential digital circuit 100 may include input control circuits 130 and 131 and time differential measurement circuit 110. The time differential measurement circuit 110 may include a synchronization pattern generator 111 that generates a synchronization bit pattern 112, a bit pattern detector 113 that detects changes in feedback of the synchronization bit pattern 112 caused by received event signals, and a differential time detector 114 that determines a time difference between event signals. The synchronization bit pattern 112 is a pattern of bits. The synchronization bit pattern 112 is shown as "010101 . . . " but any suitable pattern may be used.

The time differential measurement circuit 110 may include inputs 120 and 121 and an output 122. During operation of the time differential digital circuit 100, the synchronization bit pattern 112 generated by the synchronization bit pattern generator 111 is output from the output 122. The synchronization bit pattern 112 is fed back to the inputs 120 and 121 (shown as received bit streams 150 and 151) via the input control circuits 130 131 unless an event signal is received at input control circuit 130 or 131. If an event signal is received, the input control circuit receiving the event signal sends an indication of the received event signal to the corresponding input 120 or 121 inserted in the synchronization bit pattern 112 fed back to the time differential measurement circuit 110 at the inputs 120 and 121. For example, the input control circuit 130 receives event signal A. The input control circuit 130 outputs an indication of the received event signal A to the input 120. For example, the indication of the received event signal A is one or more bits that is provided to the input 120 if the event signal A is not received. As is further discussed below, an example of the change is a phase reversal of a bit of the synchronization bit pattern 112. The bit pattern detector 113 detects the change in the synchronization bit pattern 112 received at the input 120, and timestamps the detected change. Subsequently, event signal B is received at the control circuit 131. The control circuit 131 outputs an indication of the received event signal B to the input 121. The bit pattern detector 113 detects a change from the synchronization bit pattern 112 at the input 121, which is the indication associated with the received event signal B, and time stamps the detected change. The differential time detector 114 determines a time difference between event signals A and B based on a difference between the time stamps. When determining the time difference, the differential time detector 114 may also consider different delays in transmission paths as is discussed below.

The time differential measurement circuit 110 may include calibrator 115 to generate calibration signals for measuring delays in transmission paths. For example, the calibrator 115 generates a marker 116, which is a predetermined set of bits. As is further described below, the marker 116 may be designed to be detectable even if the change or indication caused by the received event signal is inserted in the marker 116. In response to the bit pattern detector 113 detecting the change from the synchronization bit pattern 112 in the bit stream 150 or 151 that is indicative of a received event signal, the marker 116 is inserted in the synchronization bit pattern 112, for example, via a multiplexor, and output from the output 122 in a bit stream that includes the marker 116 inserted into the synchronization bit pattern 112. The marker 116 is fed back to the inputs 120 and 121 by the control circuits 130 and 131 respectively. The amount of time it takes to receive the marker 116 at each of inputs 120 and 121 is associated with the delay of transmission paths associated with inputs 120 and 121. If it takes longer to receive the marker 116 at one of the inputs 120 or 121, then the difference is taken into account when the differential time detector 114 determines the time difference between event signals A and B. This calibration process is further discussed below, and improves the precision of the measurement of the time difference between event signals A and B.

The time differential digital circuit 100 may also include memory 140 to store data used by the time differential digital circuit 100. For example, the memory 140 may store the marker 116, timestamps, or any data used by the circuit 100.

The time differential digital circuit 100, for example, is implemented in hardware to allow for precise time difference measurements, such as measuring the time difference between event signals in increments, each having a duration of less than 1 nanosecond. As is further discussed below with respect to FIG. 2, the time differential digital circuit 100 may be implemented using programmable logic devices, such as one or more FPGAs, for the time differential measurement circuit 110, and may be implemented with logic gates for the input control circuits 130 and 131. Other types of hardware may be used to implement the time differential digital circuit 100, such as an application-specific integrated circuit or another type of customizable hardware.

Figure 2:
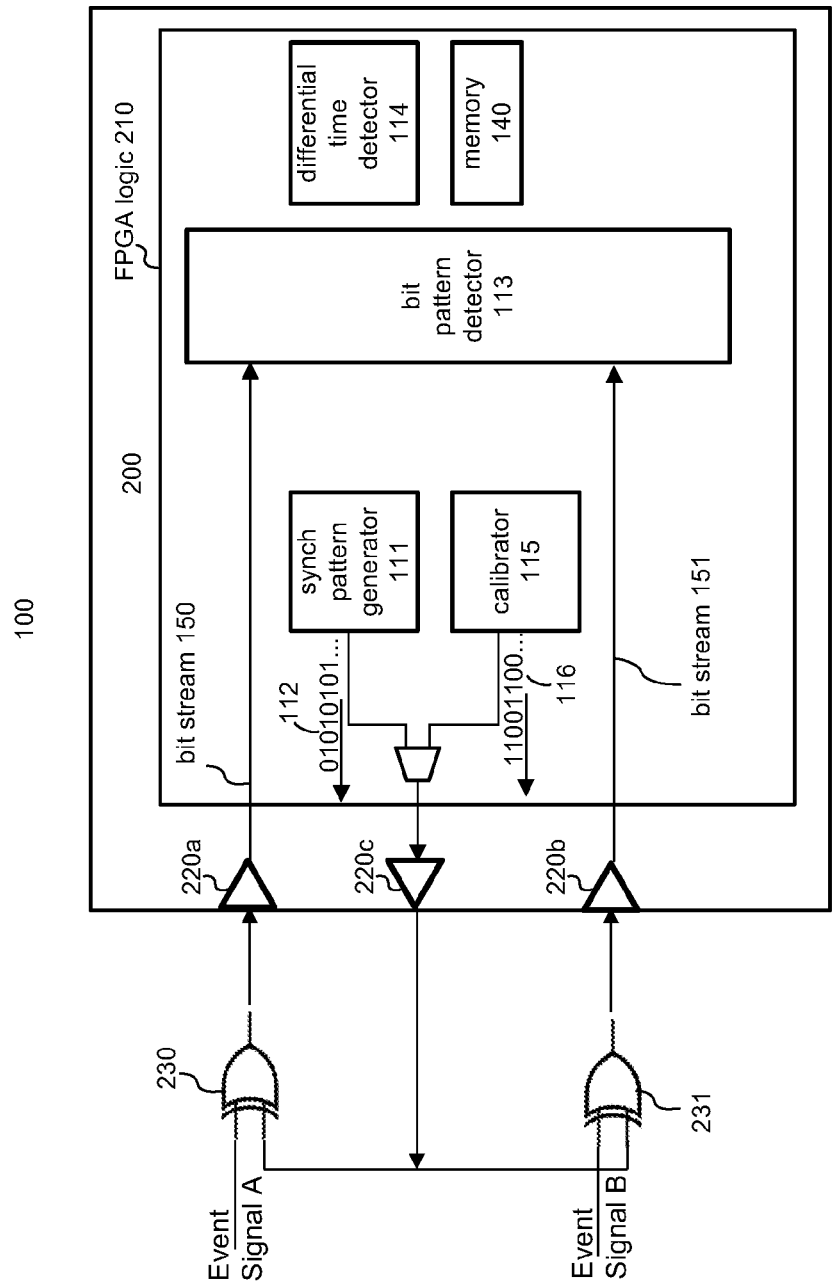
FIG. 2 illustrates a time differential digital circuit implemented with one or more field programmable gate arrays and logic gates, according to an example of the present disclosure.

FIG. 2 shows an example of the time differential digital circuit 100 implemented using FPGA 200. The FPGA 200 may include one or more FPGAs depending on the amount of programmable logic blocks that are used for the time differential measurement circuit 110. The programmable logic blocks may include memory to store the marker 116, timestamps, etc. As shown in FIG. 2, the time differential measurement circuit 110 is implemented in the FPGA logic 210. The FPGA logic 210 includes the programmable logic blocks of the FPGA 200. One or more FPGA transceivers 220 may be used for the inputs 120 and 121 and the output 122. For example, the FPGA 200 may include gigabit transceivers that can operate at transmission rates above 1 Gbps. Each of the transceivers 220 may transmit or receive data for the FPGA 200. For example, transceivers 220a-b are used as the inputs 120-121 and transceiver 220c is used as the output 122. The transceivers 220 may be Serializer/Deserializers (SerDes) comprised of functional blocks used for high-speed communications. The transceiver 220c may transmit data from the FPGA 200 as a bit stream of serial data bits. The bit stream of serial data bits includes the synchronization bit pattern 112 and may also include the marker 116 if an event signal is detected. The transceivers 220a-b are connected to the outputs of the control circuits 130-131 to receive streams of serial data bits (e.g., bit streams 150 and 151) therefrom. The transmission rate or receiving rate, also referred to the line rate, of the transceivers 220 is the number of serial bits each of the transceivers 220 can transmit or receive per second, and the duration of the increments for determining the time difference is determined from the line rate.

The control circuits 130 and 131, for example, include XOR gates 230 and 231, and each has inputs connected to the transceiver 220c and an input to receive one of the event signals. The output of the XOR gates 230 and 231, for example, is the synchronization bit pattern 112 or the indication of the detected event signal. Further discussion of the operation of the XOR gates 230 and 231 for detecting the event signals is provided below.

Figure 3A:
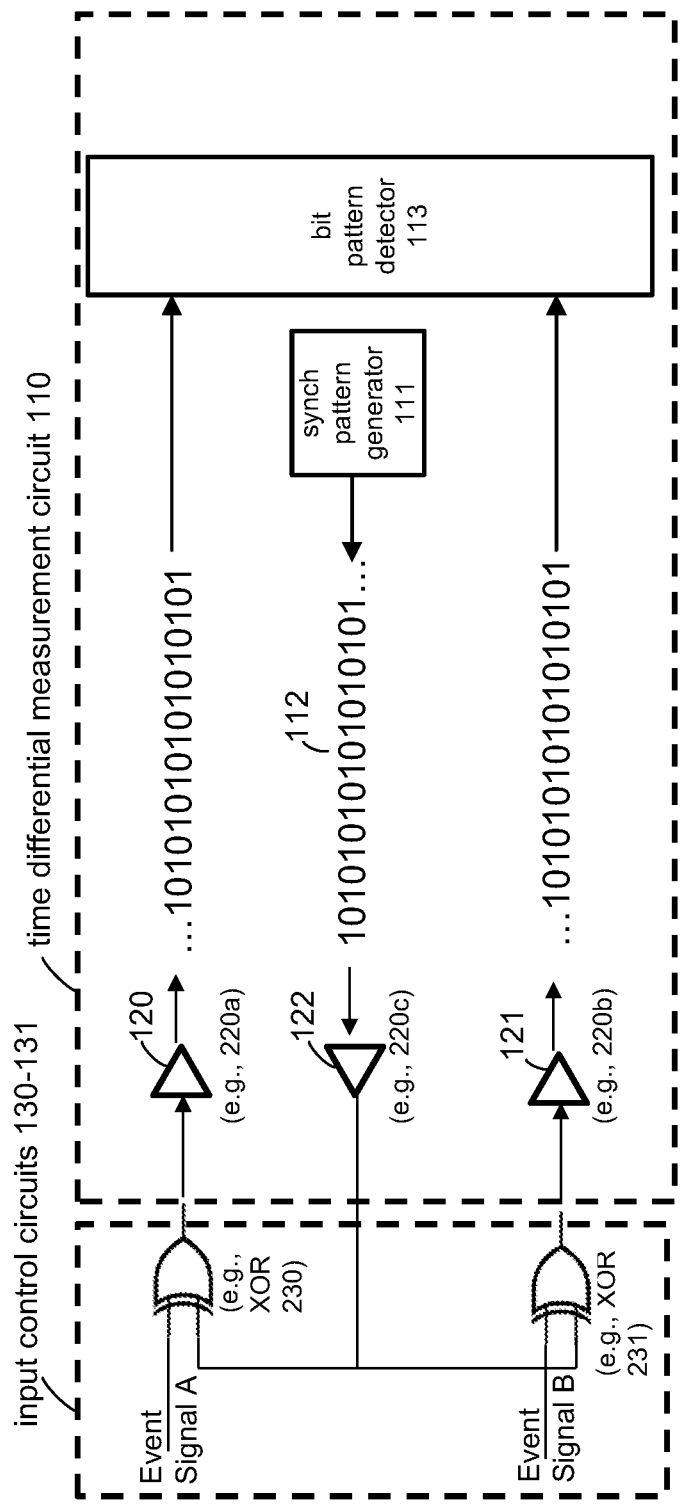
FIGS. 3A-E illustrate time differential measuring, according to an example of the present disclosure.

FIGS. 3A-E illustrate an example of time differential measuring which may be performed by the time differential digital circuit 100 shown in FIGS. 1-2. All the components of the time differential digital circuit 100 are not shown in FIGS. 3A-E so as not to obscure the representation of the example of time differential measuring performed by the time differential digital circuit 100. FIG. 3A shows the synchronization bit pattern 112 generated by the synchronization pattern generator 111 and output from the output 122, which may include transceiver 220c. The synchronization bit pattern 112 may include an alternating bit pattern, such as 1010 . . . . In FIG. 3A, assume the event signals A and B are not received. The synchronization bit pattern 112 is fed back to the time differential measurement circuit 110 via the input control circuits 130-131 (e.g., XOR gates 230 and 231). For example, the XOR gates 230 and 231 pass the synchronization bit pattern 112 back to the inputs 120 and 121 if the event signals A and B are low (e.g. "0"). Assume the control circuits 130 and 131 are detecting a logic level 1 of the event signals A and B. A logic level 0 for the event signals A and B results in passing the synchronization bit pattern 112 back to the inputs 120 and 121. In this case, the bit pattern detector 113 receives the synchronization bit pattern 112 from the inputs 120 and 121. The bit pattern detector 113 does not detect a change to the synchronization bit pattern 112, so no timestamps are recorded.

Figure 3B:
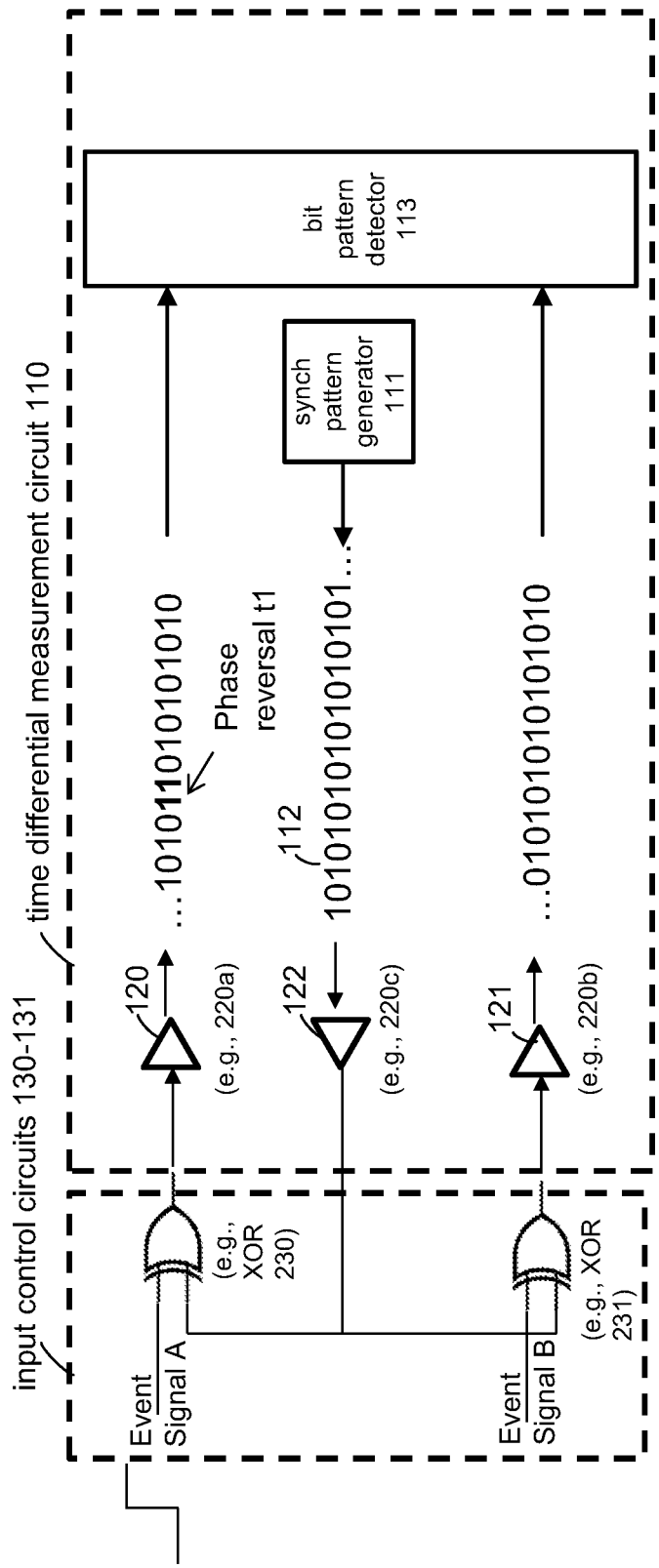

In FIG. 3B, assume the event signal A transitions to a logic level 1. The event signal A may be pulse that transitions to a logic level 1 to indicate detection of an event A and then transitions back to a logic level 0. When the event signal A transitions to a logic level 1, a logic level 1 is provided on an input to the XOR gate 230. Also, assume that at the same time the XOR gate 230 receives the logic level 1 for the event signal A input, the XOR gate 230 receives a logic level 0 of the synchronization bit pattern 112 at its other input. The output of the XOR gate 230 at this time is a logic level 1, which is an inversion of the logic level 0 of the bit of the synchronization bit pattern 112. The inversion of the bit of the synchronization bit pattern 112 is shown in FIG. 3B as the phase reversal of the bit of the synchronization bit pattern 112, and is detected by the bit pattern detector 113. In this example, the phase reversal may be detected by detecting consecutive "1's" or "0's". A timestamp t1 is stored to mark the detection of the phase reversal of the bit of the synchronization bit pattern 112 for event signal A. The phase reversal is an example of an indication of a received event signal, and is a detectable change of the synchronization bit pattern 112 that is indicative of the received event signal. In this example, the received event signal is the logic level 1 of the event signal A.

Each of the bits of the bit stream received at either of the inputs 120 and 121 represents an increment of time, and the duration of the increments is determined from the line rate of the inputs 120 and 121. For example, for a 3.125 Gbps line rate, each increment represents 320 picoseconds. A time difference between two events determined from phase reversals in the bit streams can be determined based on the number of increments or bits between phase reversals.

Figure 3C:
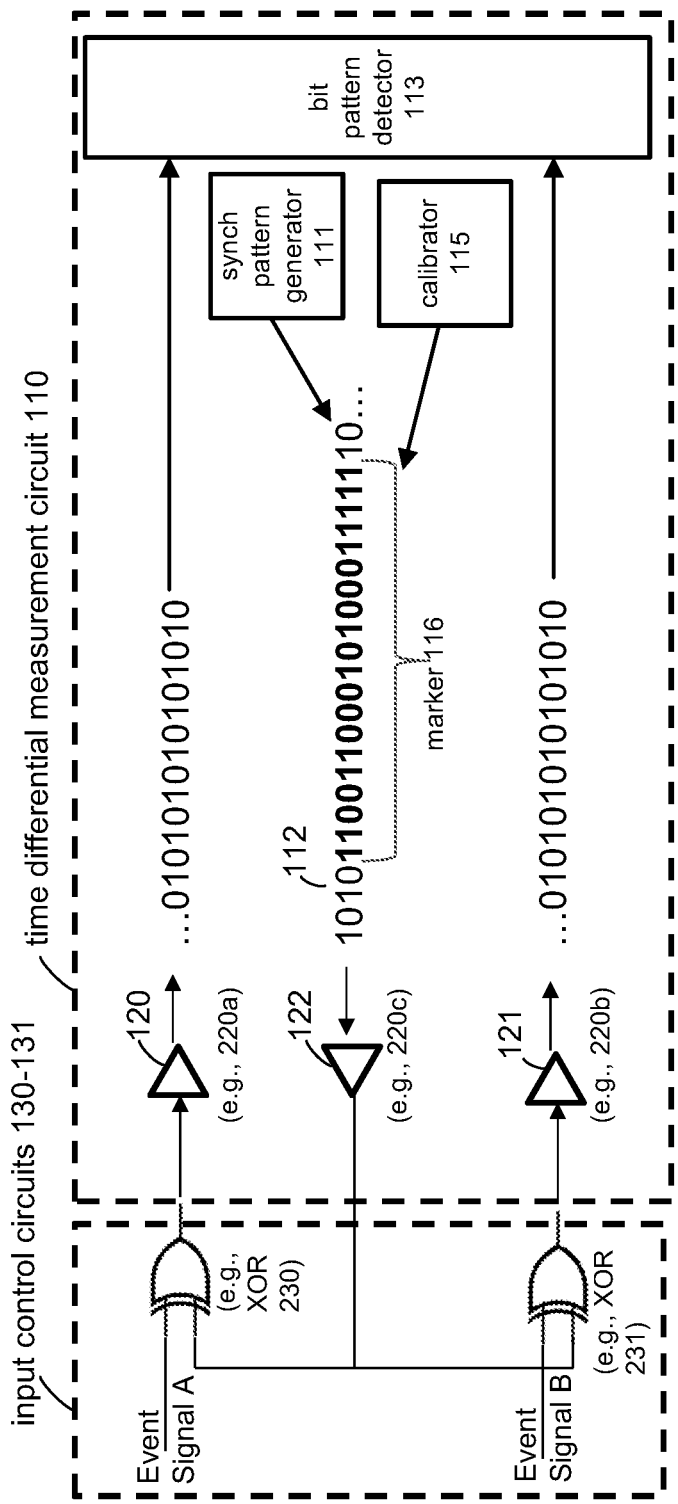
Figure 3D:
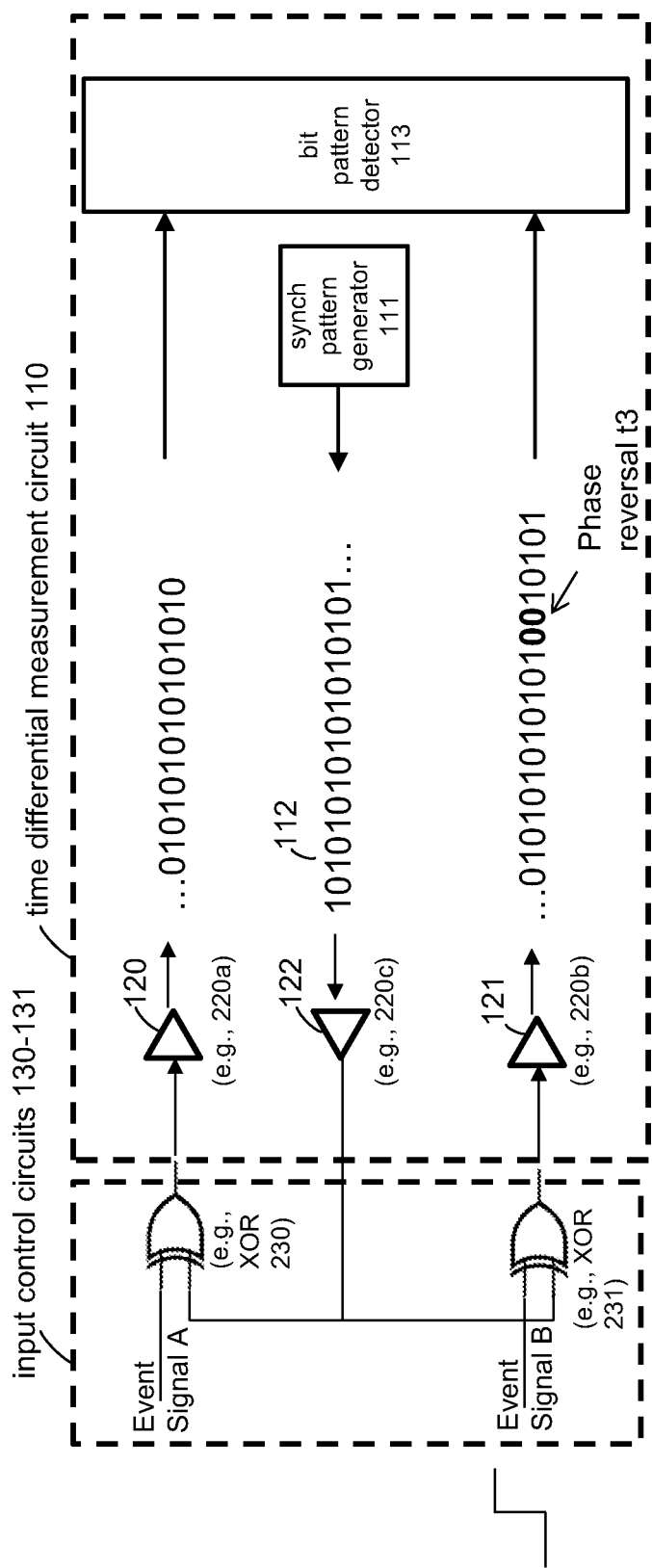

After an event is detected, such as detection of a phase reversal caused by occurrence of either event A or event B (e.g., transition to a logic level 1), the time differential measurement circuit 110 performs a calibration using the marker 116. For example, the marker 116 is scheduled for transmission in place of the synchronization bit pattern 112 at a predetermined amount of time after the phase reversal is detected. As shown in FIG. 3C, the marker 116 is output from the calibrator 115 and is inserted in the synchronization bit pattern 112 at the scheduled time. The marker 116 is eventually fed back to the inputs 120 and 121 and are timestamped when detected at the inputs 120 and 121, as is further discussed below, to determine the delay skew between input transmission paths. However, assume that the event B signal is received prior to the marker 116 being fed back to the inputs 120 and 121. As shown in FIG. 3D, a phase reversal caused by the event signal B is timestamped, shown as phase reversal t3. It should be understood that the phase reversal caused by the event B signal may appear at any time in the bit stream received at input 121 depending on when the event B signal is received (e.g., transitions to a logic level 1). Thus, the phase reversal caused by the event B signal may appear before the marker 116 is inserted in the synchronization bit pattern 112 or after the marker 116 is inserted in the synchronization bit pattern 112. The phase reversal caused by the event B signal may appear in the bit stream received at input 121 before or after the marker 116 is received in the bit stream at input 121. The phase reversal caused by the event B signal may appear in the marker 116 being received in the bit stream at input 121.

Figure 3E:
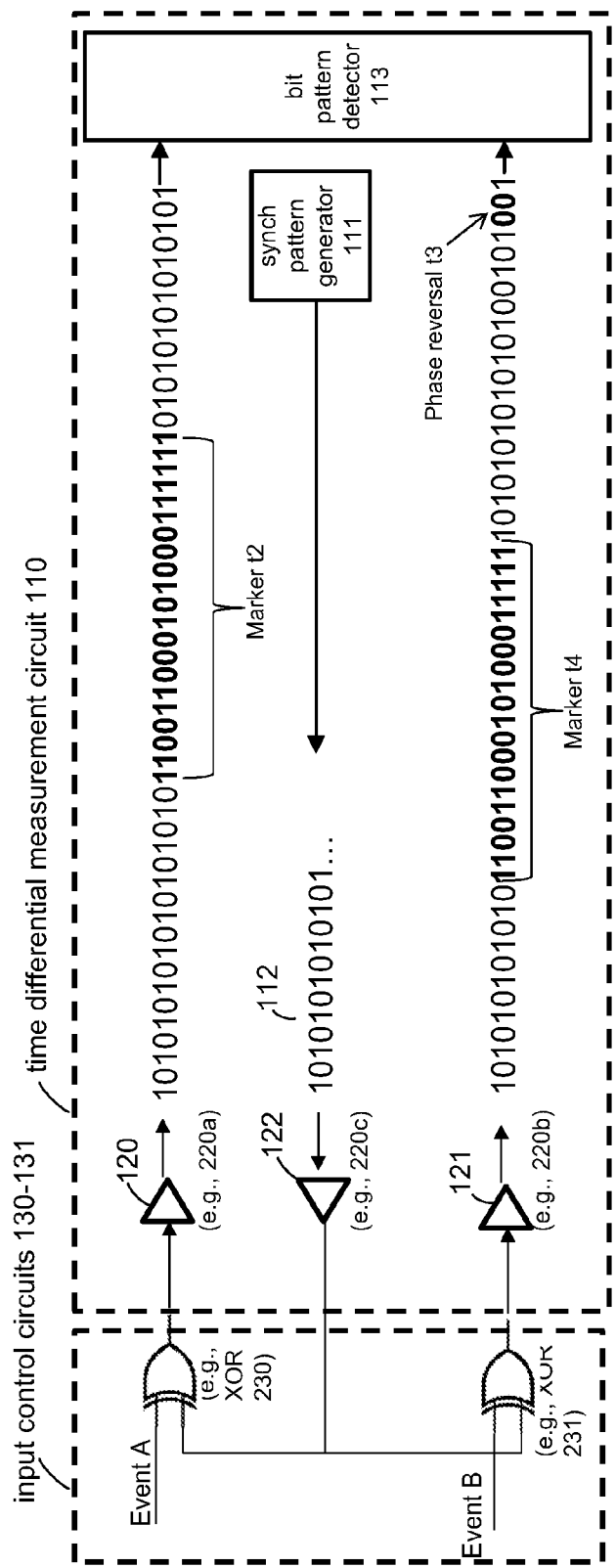

As shown in FIG. 3E, the marker 116 is received at the inputs 120 and 121. The bit pattern detector 113 detects the marker 116 in each of the bit streams received at the inputs 120 and 121, and timestamps the marker 116 in each of the bit streams. The timestamps are shown as marker t2 and marker t4.

The time difference between receiving the event signals A and B is measured with resolution of 1 serial bit period as follows: time difference=(t1−t2)−(t3−t4). The time stamps t2 and t4 are the marker times, i.e., marker t2 and marker t4 shown in FIG. 3E. Subtracting the marker times from the event times t3 (i.e., timestamp when event A was detected) and t4 (i.e., timestamp when event B was detected) takes into consideration the delays associated with the transmission paths associated with inputs 120 and 121. If the marker 116 is received at the same time in the received bit streams of the inputs 120 and 121, then t3=t4, and the delays associated with the transmission paths associated with inputs 120 and 121 are equal. In this case, the time difference between receiving the event signals A and B is t1−t3. However, if the marker 116 is not received at the same time in the received bit streams of the inputs 120 and 121, then the delays associated with the transmission paths are not equal. The delay skew is then considered in the time difference measurement by subtracting t2 and t4 from t1 and t3 respectively.

The marker 116 may be engineered to allow unambiguous detection, timestamping, and removal in the event of an arbitrarily positioned collision between the marker 116 and an occurrence of an event. For example, if an event signal is received when a marker is received at the input of the XOR gate 230 or 231, it may cause a phase reversal of a bit in the marker 116. The marker 116 may be engineered to allow the bit pattern detector 113 to detect the marker 116 when a phase reversal of a bit of the marker 116 occurs. An example of the specially engineered marker is shown in FIG. 3E. For example, the bit pattern detector 113 may check for "000111" in the second half of the marker 116 to detect the marker 116 in the bit stream, or the bit pattern detector 113 may check for "11001100" in the first half of the marker 116 to detect the marker 116 in the bit stream.

Figure 4:
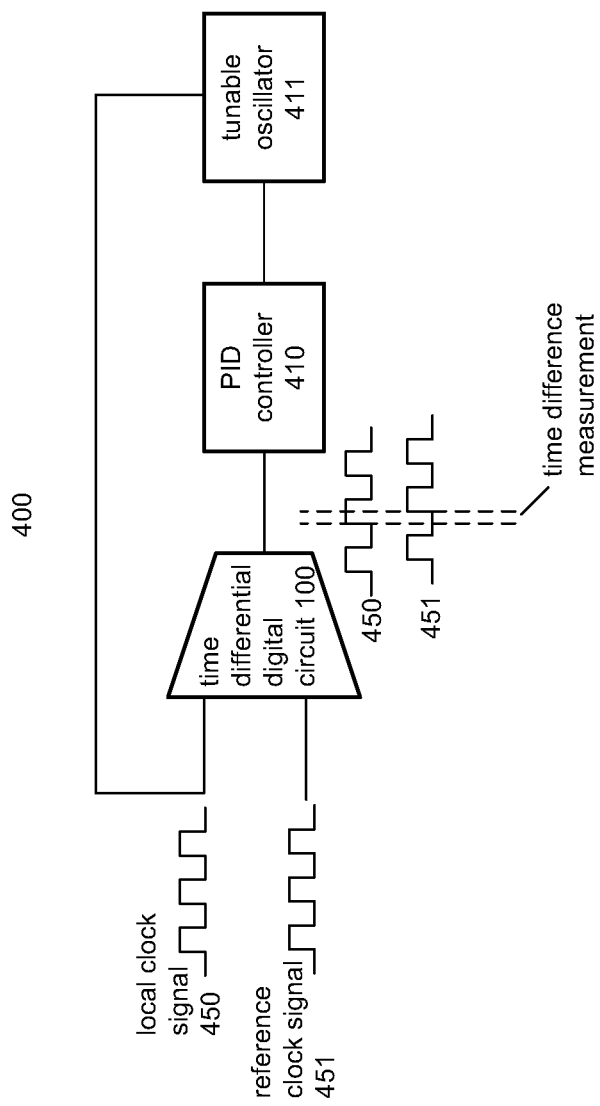
FIG. 4 illustrates a time differential digital circuit to control clock synchronization, according to an example of the present disclosure.

FIG. 4 shows an example of a circuit 400, including the time differential digital circuit 100, used to determine the time difference between two clock signals, and to calibrate a local clock based on the time difference. Clock signal 450 may be from a local clock, such as tunable oscillator 411, and reference clock signal 451 may be from an external clock. The clock signals 450 and 451 are event signals A and B shown in FIGS. 1-3 in this example. The clock signals may be PPS clock signals. The local clock is synchronized to the external clock by the circuit 400. For example, the circuit 400 adjusts the tunable oscillator 411 based on the time difference between the clock signal 450 (e.g., local clock signal) and clock signal 451 (e.g., reference clock signal). The clock signals 450 and 451 are input to the time differential digital circuit 100 to determine the time difference, such as described with respect to determining the time difference between event signals. In this case, the event signals are the clock signals 450 and 451. The determined time difference is provided to proportional-integral-derivative (PID) controller 410. The PID controller 410 continuously calculates an error value from the time difference and determines an adjustment of the tunable oscillator 411 to minimize the error over time. The tunable oscillator 411 is adjusted to synchronize the clock signals 450 and 451.

Figure 5:
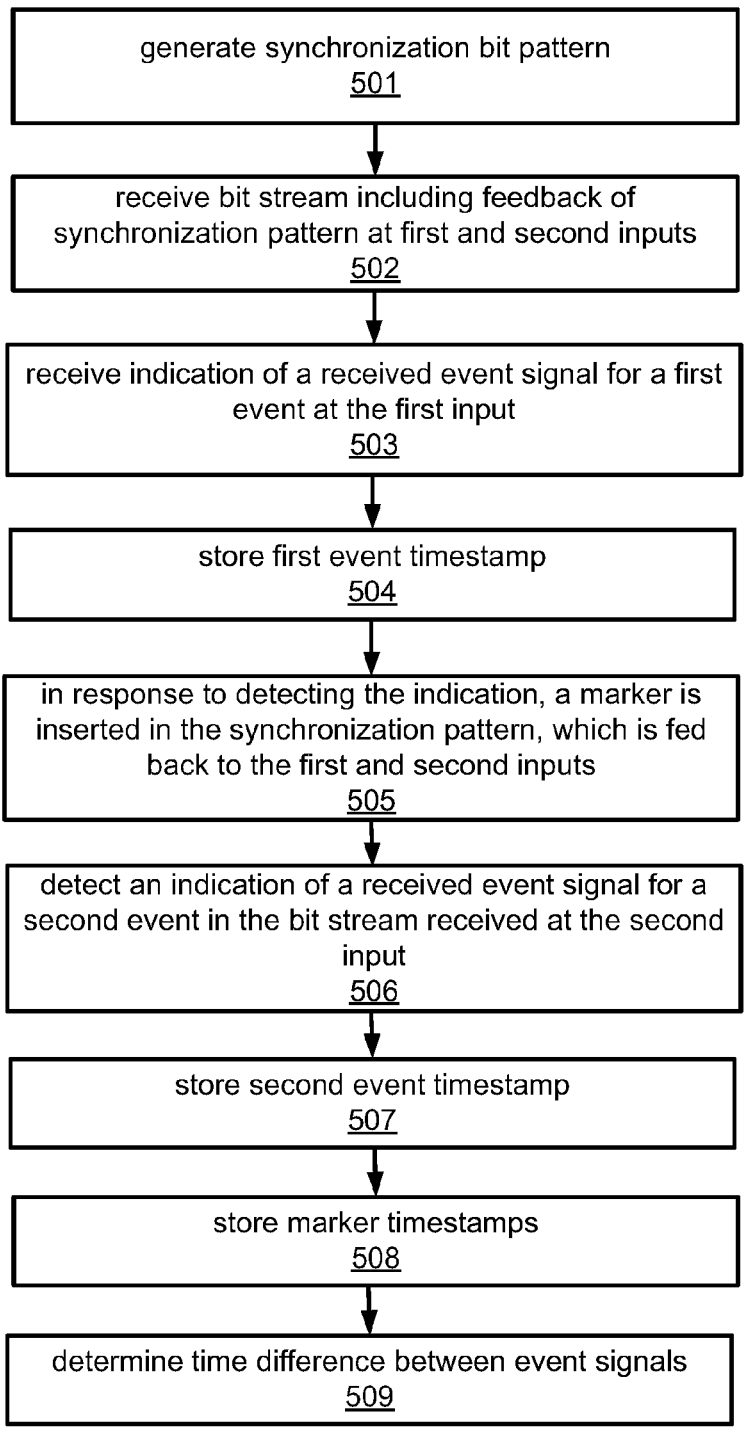
FIG. 5 illustrates a method for time differential measurement, according to an example of the present disclosure.

FIG. 5 illustrates a method 500 for determining a time difference between event signals, according to an example of the present disclosure. The method 500 may be performed by the time differential digital circuit 100 described above. One or more steps may be performed in different orders than shown or substantially simultaneously. At 501, a synchronization bit pattern (e.g., synchronization bit pattern 112) comprising alternating bits is generated. At 502, feedback, including the synchronization bit pattern, is received at the inputs 120 and 121. The feedback may be provided in a bit stream. At 503, an indication of a received event signal for a first event in the bit stream is received at the first input. The indication may be a phase reversal of a bit of the synchronization bit pattern. At 504, a first event timestamp indicating when the indication was detected is stored. At 505, in response to detecting the indication, a marker is inserted in the synchronization pattern, which is fed back to the first and second inputs. At 506, an indication of a received event signal for a second event is detected in the bit stream received at the second input. At 507, a second event timestamp indicating when the indication of the received event signal for the second event was detected is stored. At 508, marker timestamps indicating when the marker was detected in the bit streams received at the first and second inputs are stored. At 509, a time difference between the signals for the first and second events is determined based on the first and second event timestamps and the marker time stamps.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims and their equivalents in which all terms are meant in their broadest reasonable sense unless otherwise indicated.

What is claimed is:

1. A time differential digital circuit comprising:
   a synchronization pattern generator to generate synchronization bit pattern;
   a first input to receive the synchronization bit pattern or a first change in the synchronization bit pattern;
   a second input to receive the synchronization bit pattern or a second change in the synchronization bit pattern;
   a bit pattern detector to:
      detect the first change in feedback of the synchronization bit pattern at the first input caused by a first event signal, and generate a first timestamp of the detected first change at the first input; and
      detect the second change in the feedback of the synchronization bit pattern at the second input caused by a second event signal, and generate a second timestamp of the detected second change at the second input; and
   a differential time detector to determine, based on the first and second timestamps and delays associated with delay paths for the first and second inputs, a time difference between receiving the first and second event signals.

2. The time differential digital circuit of claim 1, comprising:
   a first input control circuit to receive the synchronization bit pattern and to receive the first event signal, wherein the first input control circuit outputs the synchronization bit pattern to the first input of the time differential digital circuit unless a predetermined logic level of the first event signal is received, and in response to receiving the predetermined logic level of the first event signal, the first input control circuit outputs the first change of the synchronization bit pattern.

3. The time differential digital circuit of claim 2, comprising:
   a second input control circuit to receive the synchronization bit pattern and to receive the second event signal, wherein the first input control circuit outputs the synchronization bit pattern to the second input of the time differential digital circuit unless the second event signal is received, and in response to receiving a predetermined logic level of the second event signal, the second input control circuit outputs the second change of the synchronization bit pattern.

4. The time differential digital circuit of claim 3, wherein the first and second input control circuits comprise exclusive-OR gates.

5. The time differential digital circuit of claim 1, further comprising:
   a calibrator to generate a marker in the synchronization bit pattern in response to the bit pattern detector detecting the first change or the second change in the synchronization bit pattern, and determine the delays associated with the delay paths for the first and second inputs based on detection of the marker received at the first and second inputs.

6. The time differential digital circuit of claim 5, wherein the marker comprises a set of bits that are detectable if the first change or the second change occurs in the marker.

7. The time differential digital circuit of claim 1, wherein the first event signal is a local clock signal from a local clock, and the second event signal is a reference clock signal from a reference clock, and the differential time detector determines a time difference between the local clock signal and the reference clock signal.

8. The time differential digital circuit of claim 7, wherein the local clock signal is synchronized to the reference clock signal based on the time difference.

9. The time differential digital circuit of claim 1, wherein the time difference is measured in increments of less than one nanosecond.

10. The time differential digital circuit of claim 1, wherein the synchronization bit pattern comprises alternating bits, and each of the first and second changes comprise a phase reversal of a bit in the synchronization bit pattern.

11. A time differential digital circuit to detect a time difference between first and second event signals, the time differential digital circuit comprising:
    at least one field programmable gate array (FPGA) transceiver for an FPGA, the least one field programmable gate array (FPGA) transceiver comprising a first input, a second input and an output; and
    programmed FPGA logic of the FPGA comprising:
       a synchronization pattern generator to generate a synchronization bit pattern provided to the output, wherein the synchronization bit pattern is fed back to the first and second inputs;
       a bit pattern detector to
          detect, via a first change in feedback of the synchronization bit pattern, an indication of a first event signal at the first input, and generate a first timestamp of the detected indication of receiving the first event signal;
          detect, via a second change in the feedback of the synchronization bit pattern, an indication of a second event signal at the second input, and generate a second timestamp of the detected indication of receiving the second event signal; and a differential time detector to determine, based on the first and second timestamps and delays associated with delay paths for the first and second inputs, a time difference between receiving the first and second event signals.

12. The time differential digital circuit of claim 11, comprising:

exclusive-OR (XOR) gates connected to the first and second inputs, wherein inputs of each of the XOR gates include an input to receive the synchronization bit pattern from the output of the at least one FPGA transceiver, and an input to receive the first or second event signal, and an output of each of the XOR gates is connected to one of the inputs of the at least one FPGA transceiver.

13. The time differential digital circuit of claim 12, wherein the XOR gates output the indication of the first event signal or the indication of the second event signal in response to receiving the first event signal or the second event signal on one of the inputs of the XOR gates, and the XOR gates output the synchronization bit pattern if the first event signal or the second event signal is not received on the one of the inputs of the XOR gates.

14. The time differential digital circuit of claim 11, wherein the programmed FPGA logic comprises:

a calibrator to generate a marker in the synchronization bit pattern in response to the pattern change detector detecting the indication of the first event signal or the indication of the second event signal, and determine the delays associated with the delay paths for the first and second inputs first based on detection of the marker received at the first and second inputs.

15. The time differential digital circuit of claim 14, wherein the marker comprises a set of bits that are detectable if the first change or the second change occurs in the marker.

16. The time differential digital circuit of claim 11, wherein the first event signal is a local clock signal from a local clock, and the second event signal is a reference clock signal from a reference clock, and the differential time detector determines a time difference between the local clock signal and the reference clock signal.

17. The time differential digital circuit of claim 16, wherein the local clock signal is synchronized to the reference clock signal based on the time difference.

18. The time differential digital circuit of claim 11, wherein the time difference is measured in increments of less than one nanosecond.

19. The time differential digital circuit of claim 11, wherein the synchronization bit pattern comprises alternating bits, and each of the first and second changes comprise a phase reversal of a bit in the synchronization bit pattern.

20. A method comprising:

generating synchronization bit pattern comprising alternating bits;

receiving a bit stream including feedback of the synchronization pattern at each of a first input and a second input of an integrated circuit;

detecting, via a first change in the feedback of the synchronization bit pattern, an indication of a received event signal for a first event in the bit stream received at the first input;

storing a first event timestamp indicating when the indication was detected;

inserting a marker in the synchronization pattern that is fed back to the first and second inputs in response to detecting the indication, wherein the marker comprises a predetermined set of bits that are different than the synchronization pattern;

detecting, via a second change in the feedback of the synchronization bit pattern, an indication of a received event signal for a second event in the bit stream received at the second input;

storing a second event timestamp indicating when the indication of the received event signal for the second event was detected;

storing marker timestamps indicating when the marker was detected in the bit streams received at the first and second inputs; and determining, based on the first and second event timestamps and the marker time stamps, a time difference between the signals for the first and second events.

* * * * *